United States Patent
Shiromaru et al.

(10) Patent No.: US 11,973,381 B2
(45) Date of Patent: Apr. 30, 2024

(54) FLUID MACHINE

(71) Applicant: KABUSHIKI KAISHA TOYOTA JIDOSHOKKI, Aichi-ken (JP)

(72) Inventors: Katsutoshi Shiromaru, Aichi-ken (JP); Tatsushi Mori, Aichi-ken (JP); Rieko Harada, Aichi-ken (JP); Shintaro Kashiwa, Aichi-ken (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 320 days.

(21) Appl. No.: 17/585,123

(22) Filed: Jan. 26, 2022

(65) Prior Publication Data
US 2022/0242199 A1 Aug. 4, 2022

(30) Foreign Application Priority Data
Jan. 29, 2021 (JP) .................. 2021-013130

(51) Int. Cl.
*F04B 35/04* (2006.01)
*F04B 39/06* (2006.01)
*F04C 23/02* (2006.01)
*H02K 5/20* (2006.01)
(Continued)

(52) U.S. Cl.
CPC .............. *H02K 11/33* (2016.01); *F04B 35/04* (2013.01); *F04B 39/064* (2013.01); *F04C 23/02* (2013.01); *H02K 5/203* (2021.01); *H05K 7/20272* (2013.01)

(58) Field of Classification Search
None
See application file for complete search history.

(56) References Cited

U.S. PATENT DOCUMENTS 5,491,370 A * 2/1996 Schneider .............. H02K 11/33
310/68 R
8,080,909 B2 * 12/2011 Perkins .................. H02K 9/197
310/59
(Continued)

FOREIGN PATENT DOCUMENTS

JP 2007064173 A 3/2007
JP 2011-256789 A 12/2011
(Continued)

*Primary Examiner* — Essama Omgba
*Assistant Examiner* — Geoffrey S Lee
(74) *Attorney, Agent, or Firm* — Greenblum & Bernstein, P.L.C.

(57) ABSTRACT

A fluid machine includes an electric motor, a pump, an inverter, and a housing having a motor chamber and an inverter chamber. The housing has a cooling passage having an inverter cooling passage and a motor cooling passage through which cooling fluid flows. After the cooling fluid is introduced to the inverter cooling passage, a flow of the cooling fluid is divided at the inlet into a flow of the cooling fluid flowing through the inverter cooling passage and a flow of the cooling fluid flowing through the motor cooling passage, the flow of the cooling fluid flowing through the inverter cooling passage and the flow of the cooling fluid flowing through the motor cooling passage are joined together at the outlet and discharged from the inverter cooling passage. The inverter cooling passage has a passage expanded portion in which a vortex flow is generated.

2 Claims, 3 Drawing Sheets

(51) Int. Cl.
  *H02K 11/33*    (2016.01)
  *H05K 7/20*     (2006.01)

(56) References Cited

U.S. PATENT DOCUMENTS

| | | | | |
|---|---|---|---|---|
| 2003/0206815 A1* | 11/2003 | Iritani | ............ | F04B 35/04 |
| | | | | 417/366 |
| 2003/0222519 A1* | 12/2003 | Bostwick | ............ | H02K 5/203 |
| | | | | 310/58 |
| 2005/0104460 A1* | 5/2005 | Kusase | ............ | H02K 9/04 |
| | | | | 310/58 |
| 2011/0083834 A1* | 4/2011 | Braun | ............ | H02K 5/203 |
| | | | | 29/890.038 |
| 2011/0168356 A1* | 7/2011 | Knight | ............ | H02K 11/05 |
| | | | | 165/104.19 |
| 2013/0278089 A1* | 10/2013 | Knight | ............ | H02K 5/20 |
| | | | | 310/54 |
| 2014/0232217 A1* | 8/2014 | Miyama | ............ | H02K 9/227 |
| | | | | 310/68 D |
| 2014/0354089 A1* | 12/2014 | Chamberlin | ............ | H02K 5/203 |
| | | | | 310/54 |
| 2015/0229186 A1* | 8/2015 | Sauer | ............ | H02K 5/203 |
| | | | | 165/104.28 |
| 2015/0381014 A1* | 12/2015 | Lee | ............ | H02K 9/08 |
| | | | | 310/54 |
| 2016/0056683 A1* | 2/2016 | Nakanishi | ............ | H02K 5/18 |
| | | | | 310/54 |
| 2018/0248442 A1* | 8/2018 | Fröhlich | ............ | H02K 5/20 |
| 2019/0195240 A1* | 6/2019 | Iizuka | ............ | H02K 5/18 |
| 2021/0234416 A1* | 7/2021 | Murakami | ............ | H02K 5/203 |
| 2021/0296966 A1* | 9/2021 | Yagyu | ............ | H02K 5/203 |
| 2022/0029508 A1* | 1/2022 | Gupta | ............ | H02K 3/24 |
| 2023/0105407 A1* | 4/2023 | Leonardi | ............ | H02K 9/19 |
| | | | | 310/54 |

FOREIGN PATENT DOCUMENTS

JP    2015146704 A    8/2015
JP    2020162187 A    10/2020

* cited by examiner

FLUID MACHINE

CROSS-REFERENCE TO RELATED APPLICATION

This application claims priority to Japanese Patent Application No. 2020 2021-013130 filed on Jan. 29, 2021, the entire disclosure of which is incorporated herein by reference.

BACKGROUND ART

The present disclosure relates to a fluid machine.

A fluid machine driven by an electric motor such as an electric compressor includes a rotary shaft, an electric motor rotating the rotary shaft, a pump pumping fluid with rotation of the rotary shaft, and an inverter driving the electric motor. The electric compressor includes a housing that has a motor chamber accommodating the electric motor and an inverter chamber accommodating the inverter. Japanese Patent Application Publication No. 2020-162187 discloses a configuration in which an inverter chamber is disposed on an outside in a radial direction of a rotary shaft with respect to a motor chamber in a housing, and a cooling passage is formed in a partition dividing the motor chamber and the inverter chamber in the housing. This allows cooling fluid flowing through the cooling passage to cool the electric motor and the inverter.

Even in a configuration in which a motor chamber and an inverter chamber are disposed side-by side in an axial direction of a rotary shaft, it is desired to cool a motor and an inverter efficiently with cooling fluid flowing through a cooling passage formed in a housing. In this configuration, the cooling passage needs to be formed not only for a peripheral surface of the electric motor, but for end surfaces of the electric motor in order to cool the electric motor and the inverter efficiently. However, if the cooling passage is formed of one passage, the cooling passage becomes long, which tends to cause a large pressure loss. If the cooling passage is branched so that branched passages extend to a peripheral surface and an end surface of the motor, cooling fluid tends to backflow from one of the branched passages to the other at a merging portion. These may result in a reduction of a cooling efficiency as a whole. Therefore, a configuration that suppresses a reduction in the cooling efficiency is desired.

SUMMARY

In accordance with an aspect of the present disclosure, there is provided a fluid machine including a rotary shaft, an electric motor configured to rotate the rotary shaft, a pump configured to pump a fluid with a rotation of the rotary shaft, an inverter configured to drive the electric motor, and a housing having a motor chamber accommodating the electric motor and an inverter chamber accommodating the inverter. The motor chamber and the inverter chamber are disposed side by side in an axial direction of the rotary shaft. The housing has a cooling passage through which a cooling fluid that cools the electric motor and the inverter flows. The housing includes a partition that has a plate shape and by which the motor chamber and the inverter chamber are partitioned in the axial direction of the rotary shaft, and a peripheral wall that extends in a tubular shape in the axial direction of the rotary shaft from the partition and surrounds the electric motor. The cooling passage has an inverter cooling passage through which the cooling fluid flows inside the partition, and a motor cooling passage through which the cooling fluid flows inside the peripheral wall. One end of the motor cooling passage is connected to the inverter cooling passage at a branch inlet so that the motor cooling passage is branched from the inverter cooling passage at the branch inlet, and the other end of the motor cooling passage is connected to the inverter cooling passage at a branch outlet so that the motor cooling passage joins the inverter cooling passage at the branch outlet. After the cooling fluid is introduced to the inverter cooling passage, a flow of the cooling fluid is divided at the inlet into a flow of the cooling fluid flowing through the inverter cooling passage and a flow of the cooling fluid flowing through the motor cooling passage, the flow of the cooling fluid flowing through the inverter cooling passage and the flow of the cooling fluid flowing through the motor cooling passage are joined together at the outlet and discharged from the inverter cooling passage. The inverter cooling passage has a passage expanded portion in which a vortex flow is generated. The branch outlet is formed in the passage expanded portion.

Other aspects and advantages of the disclosure will become apparent from the following description; taken in conjunction with the accompanying drawings, illustrating by way of example the principles of the disclosure.

BRIEF DESCRIPTION OF THE DRAWINGS

The disclosure, together with objects and advantages thereof, may best be understood by reference to the following description of the embodiments together with the accompanying drawings in which.

DETAILED DESCRIPTION OF THE EMBODIMENTS

The following will describe an embodiment of the present disclosure in which a fluid machine is embodied in an electric compressor, with reference to FIGS. 1 to 5. The electric compressor of the present embodiment is used for a vehicle air conditioner.

Figure 1:
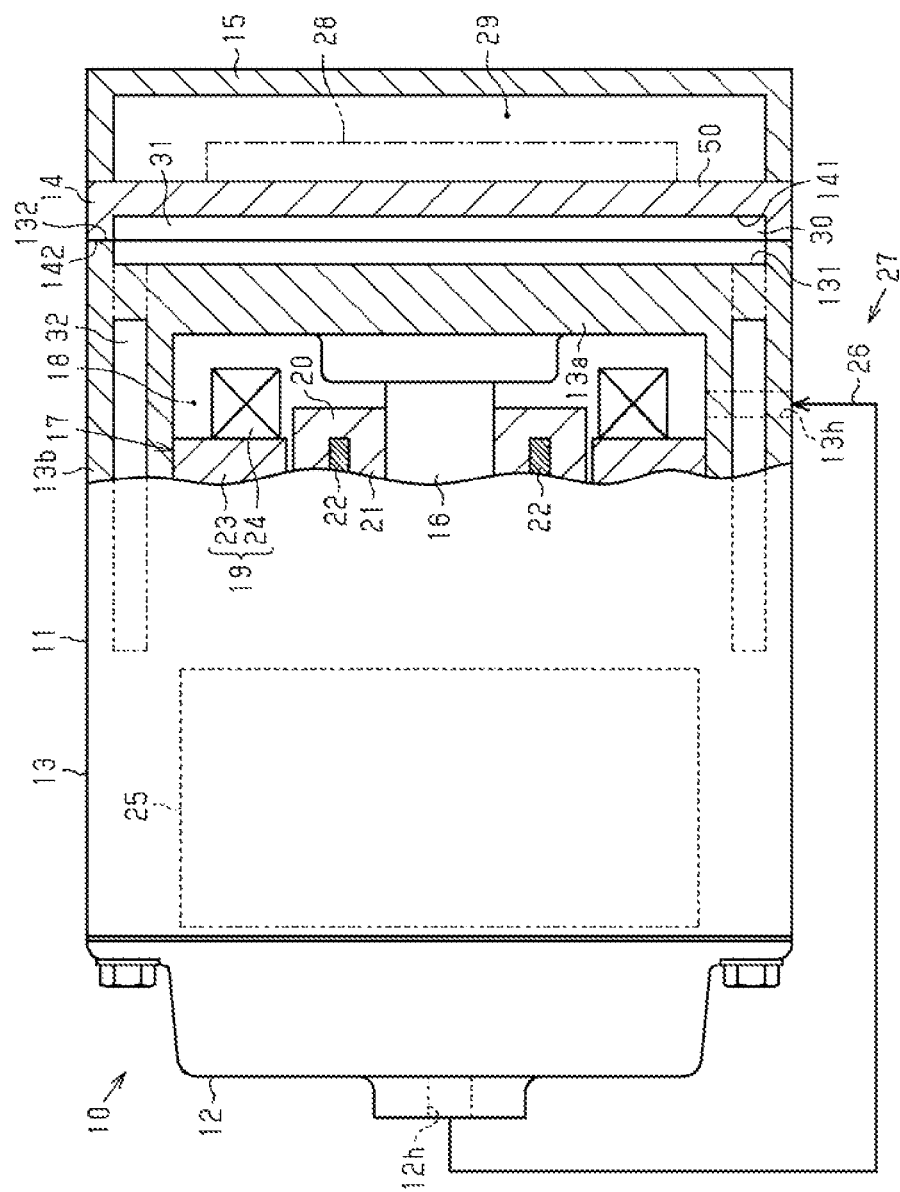
FIG. 1 is a partial cross-sectional side view of an electric compressor according to an embodiment of the present disclosure.

As illustrated in FIG. 1, an electric compressor 10 corresponding to the fluid machine includes a housing 11. The housing 11 has a tubular shape. The housing 11 includes a discharge housing 12, a motor housing 13, a passage forming housing 14, and an inverter cover 15. The discharge housing 12, the motor housing 13, the passage forming housing 14, and the inverter cover 15 are made of a metal material, such as aluminum.

The motor housing 13 includes an end wall 13a having a plate shape and a peripheral wall 13b extending in a tubular shape from an outer peripheral portion of the end wall 13a. The discharge housing 12 is connected to the motor housing 13 while closing an opening of the peripheral wall 13b of the motor housing 13. The discharge housing 12 has a bottomed tubular shape. The passage forming housing 14 is connected to an outer surface of the end wall 13a of the motor housing 13. The passage forming housing 14 has a block shape. The inverter cover 15 is connected to an end surface of the passage forming housing 14 on an opposite side of the motor housing 13. The inverter cover 15 has a bottomed tubular shape.

The electric compressor 10 includes a rotary shaft 16. The rotary shaft 16 is accommodated in the motor housing 13. An axial direction of the rotary shaft 16 coincides with an axial direction of the peripheral wall 13b of the motor housing 13.

The electric compressor 10 includes an electric motor 17. The electric motor 17 is accommodated in a motor chamber 18 formed in the motor housing 13. Thus, the housing 11 has the motor chamber 18 accommodating the electric motor 17. The electric motor 17 rotates the rotary shaft 16.

The electric motor 17 includes a stator 19 and a rotor 20. The stator 19 has a tubular shape. The rotor 20 is disposed inside the stator 19. The rotor 20 includes a rotor core 21 fixedly mounted on the rotary shaft 16 and a plurality of permanent magnets 22 provided in the rotor core 21. The rotor 20 rotates integrally with the rotary shaft 16. The stator 19 includes a stator core 23 having a tubular shape and a coil 24 wound on the stator core 23. The rotor 20 rotates with an electric power supplied to the coil 24, and the rotary shaft 16 rotates integrally with the rotor 20.

The electric compressor 10 has a compression part 25 corresponding to a pump. The compression part 25 is, for example, a scroll type compression part including a fixed scroll (not illustrated) fixed in the motor housing 13 and a movable scroll (not illustrated) disposed facing the fixed scroll. The compression part 25 compresses refrigerant as fluid with the rotation of the rotary shaft 16. Then, the compression part 25 discharges the compressed refrigerant with the rotation of the rotary shaft 16. The compression part 25 is disposed at a position closer to the opening of the peripheral wall 13b than the electric motor 17 is, in the motor housing 13. Thus, the electric motor 17 is disposed at a position closer to the end wall 13a than the compression part 25 is.

An inlet port 13h is formed in the peripheral wall 13b of the motor housing 13. Refrigerant is drawn into the motor housing 13 through the inlet port 13h. One end of an external refrigerant circuit 26 is connected to the inlet port 13h. A discharge port 12h is formed in the discharge housing 12. The other end of the external refrigerant circuit 26 is connected to the discharge port 12h.

Refrigerant drawn into the motor housing 13 through the inlet port 13h from the external refrigerant circuit 26 is compressed with the operation of compression part 25, and flows out therefrom to the external refrigerant circuit 26 through the discharge port 12h. The refrigerant flowing out to the external refrigerant circuit 26 passes through a heat exchanger (not illustrated) and an expansion valve (not illustrated) of the external refrigerant circuit 26 and is recirculated into the motor housing 13 through the inlet port 13h. The electric compressor 10 and the external refrigerant circuit 26 form a vehicle air compressor 27.

The electric compressor 10 includes an inverter 28. The inverter 28 drives the electric motor 17. The inverter 28 is accommodated in an inverter chamber 29 formed inside the inverter cover 15. Thus, the housing 11 has the inverter chamber 29 accommodating the inverter 28.

The compression part 25, the electric motor 17, and the inverter 28 are arranged in this order in the axial direction of the rotary shaft 16. Thus, the motor chamber 18 and the inverter chamber 29 are disposed side-by-side in the axial direction of the rotary shaft 16. The end wall 13a of the motor housing 13 and the passage forming housing 14 form a partition 50 which partitions the motor chamber 18 and the inverter chamber 29 in the axial direction of the rotary shaft 16. The peripheral wall 13b of the motor housing 13 extends in the axial direction of the rotary shaft 16 in a tubular manner from the partition 50 and functions as a peripheral wall that surrounds the electric motor 17.

A cooling passage 30 is formed in the housing 11. Cooling fluid that cools the electric motor 17 and the inverter 28 flows through the cooling passage 30. The cooling passage 30 has an inverter cooling passage 31 and a motor cooling passage 32. The inverter cooling passage 31 is formed in the partition 50. The inverter cooling passage 31 extends perpendicularly to the rotary shaft 16 insides the partition 50. The cooling fluid flows through the inverter cooling passage 31 to cool the inverter 28.

The motor cooling passage 32 is formed in the peripheral wall 13b of the motor housing 13. The motor cooling passage 32 extends in the axial direction of the rotary shaft 16 inside the peripheral wall 13b of the motor housing 13 from the end wall 13a, The cooling fluid flows through the motor cooling passage 32 to cool the electric motor 17. The motor cooling passage 32 and the inverter cooling passage 31 are connected.

Figure 2:
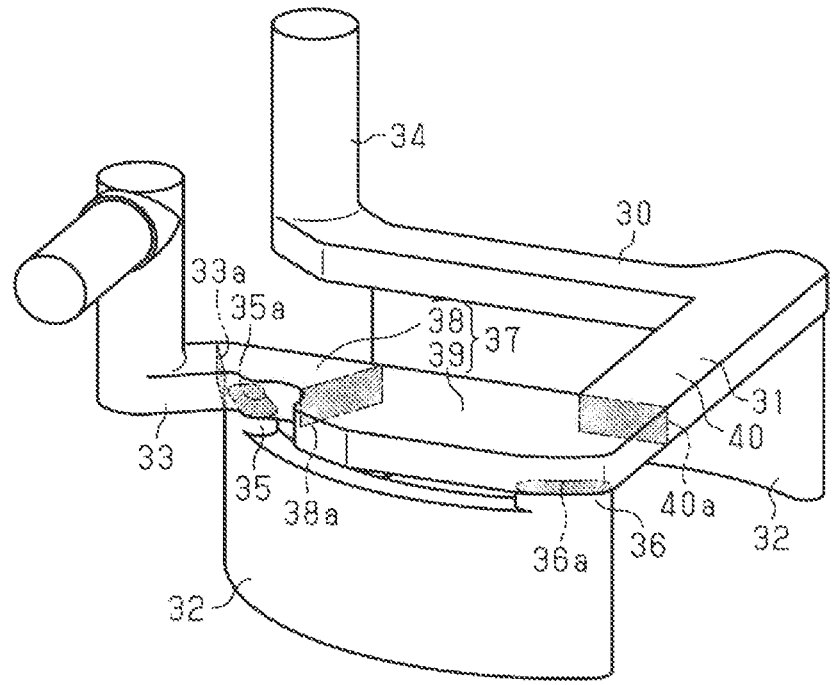
FIG. 2 is a schematic view of a modeled cooling passage.
Figure 3:
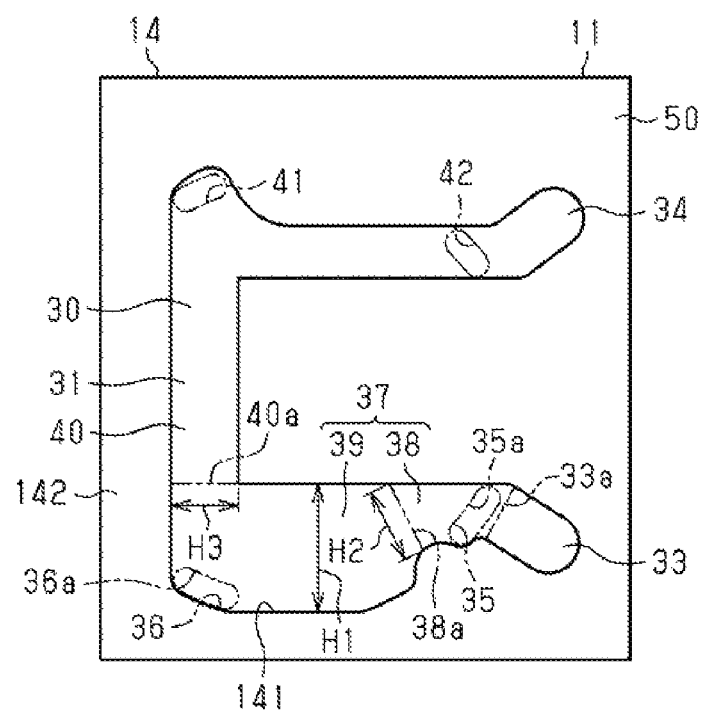
FIG. 3 is a view of a passage forming housing, as viewed in an axial direction of a rotary shaft.

In FIG. 2, the motor cooling passage 32 and the inverter cooling passage 31 are modeled. In FIG. 3, the inverter cooling passage 31 is viewed in the axial direction of the rotary shaft 16. As illustrated in FIGS. 2 and 3, the passage forming housing 14 includes a supply port 33, and a discharge port 34. The cooling fluid is supplied from the supply port 33 to the inverter cooling passage 31. The cooling fluid having flowed through the inverter cooling passage 31 is discharged to an outside from the discharge port 34.

As illustrated in FIG. 3, a passage forming recess 141, which forms the inverter cooling passage 31, is formed in an outer surface of the passage forming housing 14. The passage forming recess 141 has a U-shape, as viewed in the axial direction of the rotary shaft 16. A bottom surface of the passage forming recess 141 is a flat surface. The supply port 33 is in communication with one end of the passage forming recess 141. The discharge port 34 is in communication with the other end of the passage forming recess 141. Part of the outer surface of the passage forming housing 14 other than the passage forming recess 141, as viewed in the axial direction of the rotary shaft 16, forms a mating surface 142 with which an outer surface of the end wall 13a of the motor housing 13 is to be mated.

Figure 4:
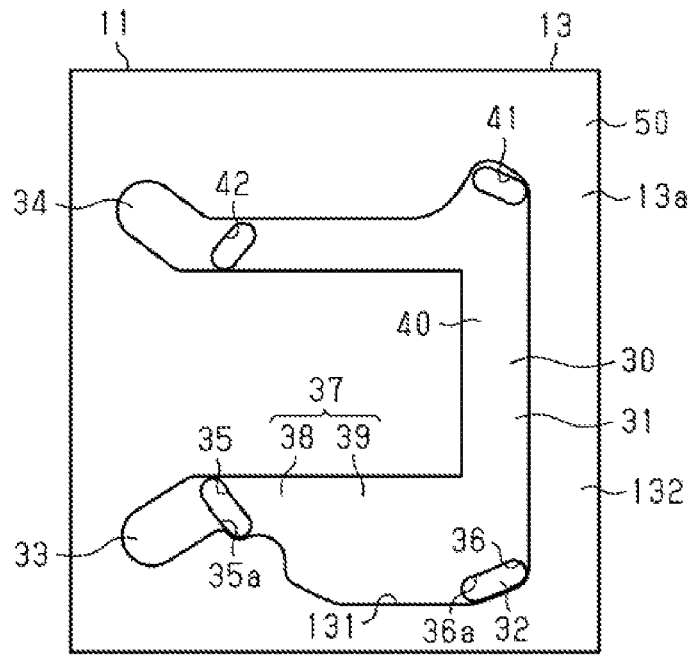
FIG. 4 is a view of a motor housing, as viewed in an axial direction of a rotary shaft.

As illustrated in FIG. 4, a passage forming recess 131, which forms the inverter cooling passage 31, is formed in the outer surface of the motor housing 13. The passage forming recess 131 has a U-shape as viewed in the axial direction of the rotary shaft 16. A bottom surface of the passage forming recess 131 is a flat surface. The passage forming recess 131 of the motor housing 13 has a shape extending along the passage forming recess 141 of the passage forming housing 14. Part of the outer surface of the motor housing 13 other than the passage forming recess 131, as viewed in the axial direction of the rotary shaft 16, forms a mating surface 132 with which the mating surface 142 is to be mated.

As illustrated in FIGS. 3 and 4, the passage forming housing 14 and the motor housing 13 are connected with the mating surface 142 of the passage forming housing 14 and the mating surface 132 of the motor housing 13 facing each other. The inverter cooling passage 31 is defined by the passage forming recess 141 of the passage forming housing 14 and the passage forming recess 131 of the motor housing 13. Thus, the inverter cooling passage 31 has a U-shape, as viewed in the axial direction of the rotary shaft 16.

The motor housing 13 has an inlet 35 as a branch inlet through which cooling fluid flows into the motor cooling passage 32 from the inverter cooling passage 31, and an outlet 36 as a branch outlet through which the cooling fluid flows out from the motor cooling passage 32 into the inverter cooling passage 31. One end of the motor cooling passage 32 is connected to the inverter cooling passage 31 at the inlet 35, and the other end of the motor cooling passage 32 is connected to the inverter cooling passage 31 at the outlet 36. Thus, the motor cooling passage 32 is branched from the inverter cooling passage 31 at the inlet 35 and joins the inverter cooling passage 31 at the outlet 36 in the cooling passage 30. The inlet 35 and the outlet 36 are opened at the bottom surface of the passage forming recess 131. The inlet 35 is positioned closer to the supply port 33 than the outlet 36 is. The inlet 35 and the outlet 36 are formed at a boundary between the end wall 13a forming a part of the partition 50 of the housing 11 and the peripheral wall 13b.

The inverter cooling passage 31 has a communication passage 37 that provides communication between the inlet 35 and the outlet 36. In the inverter cooling passage 31, the inlet 35 and the outlet 36 are in communication through the communication passage 37. The communication passage 37 extends from a position facing the inlet 35 to a position facing the outlet 36 in the inverter cooling passage 31. The communication passage 37 includes a first passage 38 in communication with the inlet 35, and a second passage 39 in communication with the outlet 36. In the communication passage 37, the first passage 38 is positioned upstream of the second passage 39 in a direction in which the cooling fluid flows through the inverter cooling passage 31, The first passage 38 provides communication between the supply port 33 and the second passage 39 in the inverter cooling passage 31. The inverter cooling passage 31 further includes a third passage 40 that provides communication between the second passage 39 and the discharge port 34. The motor housing 13 has an inlet 41 through which the cooling fluid flowing in the third passage 40 is introduced to the motor cooling passage 32, and an outlet 42 through which the cooling fluid having flowed through the motor cooling passage 32 flows out to the third passage 40.

As illustrated in FIG. 3, the first passage 38 and the third passage 40 are in communication through the second passage 39 in the inverter cooling passage 31. As viewed in the axial direction of the rotary shaft 16, the second passage 39 has a width H1 that is substantially constant from an end of the second passage 39 adjacent to the first passage 38 to an end thereof adjacent to the third passage 40. As viewed in the axial direction of the rotary shaft 16, the width H1 of the second passage 39 is greater than a width H2 of the first passage 38. More specifically, the width H1 of the second passage 39 is greater than the width H2 of an exit 38a of the first passage 38. Since the passage forming recess 141 and the passage forming recess 131 are flat, the second passage 39 that is expanded relative to the first passage 38 functions as a passage expanded portion in which a vortex flow is generated. As viewed in the axial direction of the rotary shaft 16, the width H1 of the second passage 39 increases in a direction in which it is separated from an entrance 40a of the third passage 40. As viewed in the axial direction of the rotary shaft 16, the width H1 of the second passage 39 is greater than a width H3 of the third passage 40. More specifically, the width H1 of the second passage 39 is greater than the width H3 of the entrance 40a of the third passage 40.

Since the passage forming recess 141 and the passage forming recess 131 are flat, the outlet 36 is positioned in a projection area of the second passage 39, as viewed in the axial direction of the rotary shaft 16. The outlet 36 is in communication with the second passage 39 at a position spaced from the third passage 40. Thus, the outlet 36 is provided in the second passage 39.

A cross sectional area of the exit 38a of the first passage 38 is smaller than that of an exit 33a of the supply port 33. The width H1 of the second passage 39 is set at least two times greater than the width H2 of the exit 38a of the first passage 38. Thus, a cross sectional area of the second passage 39 is at least two times greater than that of the exit 38a of the first passage 38. In addition, the width H1 of the second passage 39 is set at least two times greater than the width H3 of the entrance 40a of the third passage 40. Thus, the cross sectional area of the second passage 39 is at least two times greater than that of the entrance 40a of the third passage 40. A cross sectional area of an entrance 35a of the inlet 35 is substantially the same as that of an exit 36a of the outlet 36. The cross sectional area of the exit 38a of the first passage 38 is substantially the same as those of the entrance 35a of the inlet 35 and the exit 36a of the outlet 36.

After cooling fluid is introduced to the inverter cooling passage 31 from the outside, a flow of the cooling fluid is divided at the inlet 35 into a flow of the cooling fluid flowing through the inverter cooling passage 31 and a flow of the cooling fluid flowing through the motor cooling passage 32, the flow of the cooling fluid flowing through the inverter cooling passage 31 and the flow of the cooling fluid flowing through the motor cooling passage 32 are joined together at the outlet 36 and discharged to the outside through the inverter cooling passage 31.

The following will describe the operation of the present embodiment.

Figure 5:
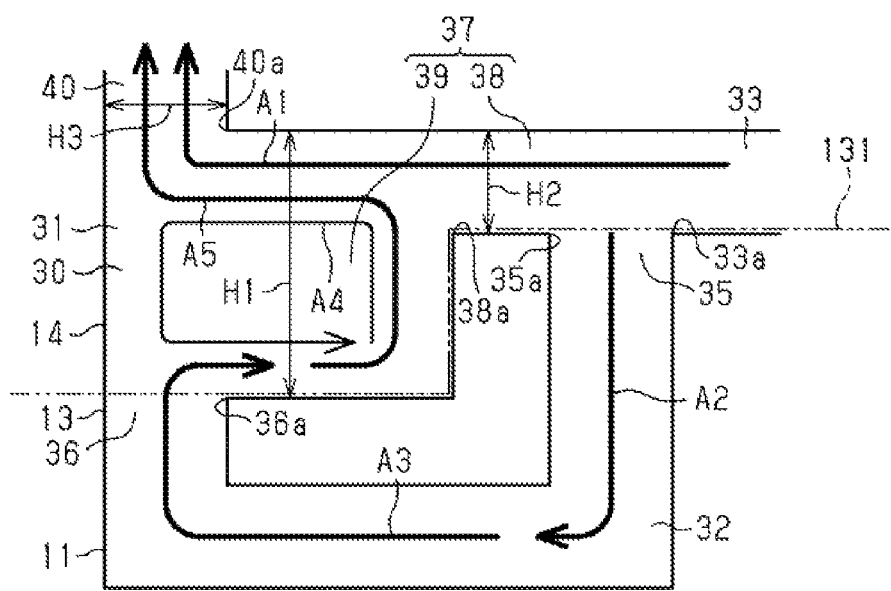
FIG. 5 is a schematic developed view, illustrating an inverter cooling passage and a motor cooling passage.

FIG. 5 is a schematic view, illustrating the inverter cooling passage 31 and the motor cooling passage 32. As illustrated in FIG. 5, cooling fluid supplied from the supply port 33 to the inverter cooling passage 31 flows into the first passage 38. The cooling fluid flowing through the first passage 38 is divided so that part of the cooling fluid flows toward the second passage 39 and part of the cooling fluid flows into the motor cooling passage 32 through inlet 35 in the communication passage 37. Thus, part of the cooling fluid flowing through the inverter cooling passage 31 is separated at the inlet 35 to flow through the motor cooling passage 32.

The cooling fluid having flowed toward the second passage 39 from the first passage 38 flows through the second passage 39 into the third passage 40, and flows through the third passage 40 to be discharged out from the discharge port 34 in the communication passage 37, as indicated by the arrow A1 in FIG. 5. Part of the cooling fluid flowing through the third passage 40 is introduced from the inlet 41 to flow through the motor cooling passage 32, flows out to the third passage 40 from the outlet 42, and is then discharged to the outside from the discharge port 34.

On the other hand, the cooling fluid introduced into the motor cooling passage 32 through the inlet 35 from the first passage 38, as indicated by an arrow A2 in FIG. 5, flows through the motor cooling passage 32 and flows out to the second passage 39 of the inverter cooling passage 31 through the outlet 36, as indicated by an arrow A3 in FIG. 5. Thus, the cooling fluid flowing through the motor cooling passage 32 joins the cooling fluid flowing through the inverter cooling passage 31 at the outlet 36. At this time, as viewed in the axial direction of the rotary shaft 16, the width H1 of the second passage 39 is greater than the width H2 of the first passage 38, and the outlet 36 is positioned in the projection area of the second passage 39. Since the passage is expanded in this manner, vortex flow of the cooling fluid is generated in the second passage 39, as indicated by an arrow A4 in FIG. 5, which causes a slight pressure loss. Thus, the cooling fluid flowing through the motor cooling passage 32 flows out to the second passage 39 through the outlet 36 more easily, for example, as compared with a case where the width H1 of the second passage 39 is equal to or smaller than the width H2 of the first passage 38. This allows the cooling fluid to flow through the motor cooling passage 32 more easily, and suppresses a reduction in the cooling efficiency by the cooling fluid flowing through the motor cooling passage 32.

The cooling fluid having flowed out to the second passage 39 of the inverter cooling passage 31 from the motor cooling passage 32 through the outlet 36 flows along the vortex flow of the cooling fluid and the flow of the cooling fluid from the first passage 38 to the second passage 39 toward the third passage 40, flows through the third passage 40, and is discharged out from the discharge port 34, as indicated by an arrow A5 in FIG. 5.

Heat generated from the inverter 28 is transmitted to the passage forming housing 14, and is dissipated with the cooling fluid flowing through the inverter cooling passage 31. Accordingly, the inverter 28 is cooled by the cooling fluid flowing through the inverter cooling passage 31. In addition, heat generated from the electric motor 17 is transmitted to the peripheral wall 13b of the motor housing 13, and is dissipated with the cooling fluid flowing through the motor cooling passage 32. The electric motor 17 is cooled by the cooling fluid flowing through the motor cooling passage 32.

The embodiment described above offers the following effects.

(1) The inverter 28 is cooled by the cooling fluid flowing through the inverter cooling passage 31. Part of the cooling fluid flowing through the inverter cooling passage 31 is separated at the inlet 35 and flows through the motor cooling passage 32. The cooling fluid flowing through the motor cooling passage 32 joins the cooling fluid flowing through the inverter cooling passage 31 at the outlet 36. The inverter cooling passage 31 has the second passage 39 in which vortex flow is generated, and the outlet 36 is formed in the second passage 39. According to this configuration, a slight pressure loss is caused by the generation of the vortex flow in the inverter cooling passage 31, which allows the cooling fluid flowing through the motor cooling passage 32 to join the cooling fluid flowing through the second passage 39 through the outlet 36 more easily, as compared with the case where the vortex flow is not generated. Thus, the cooling fluid flows through the motor cooling passage 32 easily. As a result, a reduction in the cooling efficiency by the cooling fluid flowing through the cooling passage 30 may be suppressed.

(2) The inlet 35 and the outlet 36 are formed at the boundary between the end wall 13a forming a part of the partition 50 of the housing 11 and the peripheral wall 13b. This configuration is suitable for forming the cooling passage 30 having an excellent cooling performance. Further, according to this configuration, the motor cooling passage 32 is branched out from and joined to the inverter cooling passage 31 in a perpendicular direction. Although this configuration tends to cause a backflow of the cooling fluid at a merging point, the second passage 39 suppresses such backflow of the cooling fluid effectively.

(3) The cross-sectional area of the second passage 39 is at least two times greater than that of the first passage 38. This configuration is suitable for allowing the cooling fluid flowing through the motor cooling passage 32 to flow out to the second passage 39 easily through the outlet 36.

(4) As viewed in the axial direction of the rotary shaft 16, the width of the second passage 39 increases in a direction in which it is separated from the entrance 40a of the third passage 40, and the outlet 36 is in communication with the second passage 39 at a position spaced from the third passage 40. This allows the cooling fluid flowing through the motor cooling passage 32 to flow into the second passage 39 through the outlet 36 easily. As a result, the cooling fluid flows through the motor cooling passage 32 smoothly, which may suppress the pressure loss of the cooling fluid flowing though the motor cooling passage 32.

It is noted that the above-described embodiment may be modified in various manners, as exemplified below. The above-described embodiment and its modifications may be combined within the scope consistent with the present disclosure.

In the embodiment, the cross sectional area of the second passage 39 need not be at least two times greater than that of the first passage 38 as long as the cross sectional area of the second passage 39 is greater than that of the first passage 38.

Although the inverter cooling passage 31 has a U-shape, as viewed in axial direction of the rotary shaft 16 in the above-described embodiment, the shape of the inverter cooling passage 31 is not particularly limited thereto.

In the embodiment, the electric compressor 10 may have the inverter cooling passage 31 formed in the end wall 13a of the motor housing 13, for example. In this case, the electric compressor 10 need not include the passage forming housing 14. In short, it is sufficient that the inverter cooling passage 31 is formed in the partition 50 by which the motor chamber 18 and the inverter chamber 29 are partitioned in the axial direction of the rotary shaft 16.

In the embodiment, the compression part 25 is not limited to the scroll type, but may be a piston type or a vane type compression part.

In the embodiment, the fluid machine is embodied as the electric compressor 10 and used for the vehicle air conditioner 27, but is not limited thereto. For example, the fluid machine may be mounted on a fuel cell vehicle as an electric compressor that compresses air as fluid to be supplied to a fuel cell battery, or as an electric pump that pumps hydrogen as fluid to be supplied to the fuel cell battery with a pump.

What is claimed is:

1. A fluid machine comprising: a rotary shaft; an electric motor configured to rotate the rotary shaft; a pump configured to pump a fluid with rotation of the rotary shaft; an inverter configured to drive the electric motor; and a housing having a motor chamber accommodating the electric motor and an inverter chamber accommodating the inverter, wherein the motor chamber and the inverter chamber are disposed side by side in an axial direction of the rotary shaft, the housing has a cooling passage through which a cooling fluid that cools the electric motor and the inverter flows, the housing includes a partition that has a plate shape and by which the motor chamber and the inverter chamber are partitioned in the axial direction of the rotary shaft, and a peripheral wall that extends in a tubular shape in the axial direction of the rotary shaft from the partition and that surrounds the electric motor, the cooling passage has: an inverter cooling passage through which the cooling fluid flows inside the partition; and a motor cooling passage through which the cooling fluid flows inside the peripheral wall, one end of the motor cooling passage is connected to the inverter cooling passage at a branch inlet so that the motor cooling passage is branched from the inverter cooling passage at the branch inlet, and the other end of the motor cooling passage is connected to the inverter cooling passage at a branch outlet so that the motor cooling passage joins the inverter cooling passage at the branch outlet, wherein the cooling passage is configured such that after the cooling fluid is introduced to the inverter cooling passage, a flow of the cooling fluid is divided into a flow of the cooling fluid flowing through the inverter cooling passage and a flow of the cooling fluid flowing through the motor cooling passage at the branch inlet, the flow of the cooling fluid flowing through the inverter cooling passage and the flow of the cooling fluid flowing through the motor cooling passage are joined together at the branch outlet and discharged from the inverter cooling passage, the inverter cooling passage has a passage expanded portion configured such that a vortex flow is generated therein when the cooling fluid flows through the passage expanded portion, and the branch outlet is formed in the passage expanded portion.

2. The fluid machine according to claim 1, wherein
the inverter cooling passage extends perpendicularly to the rotary shaft inside the partition,
the motor cooling passage extends in the axial direction of the rotary shaft inside the peripheral wall, and
the branch inlet and the branch outlet are formed at a boundary between the partition and the peripheral wall.

* * * * *